(12) United States Patent
Kimura et al.

(10) Patent No.: US 9,652,377 B2
(45) Date of Patent: May 16, 2017

(54) MEMORY SYSTEM

(71) Applicant: Kabushiki Kaisha Toshiba, Tokyo (JP)

(72) Inventors: Akihiro Kimura, Aichi (JP); Hiroki Matsushita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 461 days.

(21) Appl. No.: 13/782,951

(22) Filed: Mar. 1, 2013

(65) Prior Publication Data

US 2013/0254464 A1 Sep. 26, 2013

(30) Foreign Application Priority Data

Mar. 21, 2012 (JP) ................. 2012-064253

(51) Int. Cl.
*G06F 12/00* (2006.01)
*G06F 12/02* (2006.01)
*G06F 1/32* (2006.01)

(52) U.S. Cl.
CPC ........ *G06F 12/0246* (2013.01); *G06F 1/3275* (2013.01); *G06F 2212/1032* (2013.01); *G06F 2212/7203* (2013.01); *Y02B 60/1225* (2013.01); *Y02B 60/1228* (2013.01)

(58) Field of Classification Search
CPC .............. G06F 12/0246; G06F 1/3275; G06F 2212/1032; G06F 2212/7203; Y02B 60/1225; Y02B 60/1228

USPC ........................................................ 711/103
See application file for complete search history.

(56) References Cited

U.S. PATENT DOCUMENTS

| 5,835,780 A | 11/1998 | Osaki et al. |
| 2010/0008175 A1* | 1/2010 | Sweere ............... G06F 12/0866 365/229 |
| 2012/0246398 A1* | 9/2012 | Hosaka ............... G06F 11/1441 711/103 |

FOREIGN PATENT DOCUMENTS

| JP | 08-241151 | 9/1996 |
| JP | 2004078963 A | 3/2004 |

* cited by examiner

*Primary Examiner* — Matthew Bradley
(74) *Attorney, Agent, or Firm* — Patterson & Sheridan, LLP

(57) ABSTRACT

According to one embodiment, the memory system includes a nonvolatile semiconductor memory, a data buffer, a volatile memory for storing a management table uniquely associates the user data with an address of the physical storage region of nonvolatile semiconductor memory, a controller that carries out a force quit process for writing the user data stored in a data buffer, the management table stored in volatile memory into the nonvolatile semiconductor memory, and a storage battery. The controller starts the force quit process prior to the power supply of the internal power supply regulator is switched from an external power supply to the storage battery.

17 Claims, 5 Drawing Sheets

MEMORY SYSTEM

CROSS-REFERENCE TO RELATED APPLICATION

This application is based upon and claims the benefit of priority from Japanese Patent Application No. 2012-064253, filed Mar. 21, 2012; the entire contents of which are incorporated herein by reference.

FIELD

Embodiments described herein relate to a memory system.

BACKGROUND

In addition to Hard Disk Drives (HDD), Solid State Drives (SSD) are also used as an external storage device for personal computers and other information processing devices. SSDs typically include a nonvolatile semiconductor memory, such as a Negated AND or NOT AND (NAND) type flash memory.

A management table is needed to uniquely associate the user data input from a host with the address of the physical storage region of the NAND-type flash memory for SSD. It is necessary to write the management table along with the user data stored in a data buffer inside the SSD into the NAND-type flash memory until the power of the external power supply stops.

However, since it is necessary to write all of the user data and the management table into the NAND-type flash memory, a storage battery with high capacity is needed as a backup power supply. Also, the management table usually has a data size that is about 1/1000 of the storage capacity of the SSD. However, the data size of the management table increases along with an increase in the storage capacity of the SSD. Therefore, it is necessary to increase the capacity of the storage battery to account for these increases. However, it is difficult to assemble a storage battery with high capacity due to the size restrictions of the packaging of the SSD.

DETAILED DESCRIPTION

Embodiments described herein provide a memory system that can reduce the capacity of a storage battery used as a backup power supply in a solid state drive (SSD) device.

In general, the several embodiments to be described below are only examples of the device and method for embodying the technical gist of the invention. The embodiments are not limited by the shapes, structures, configurations, or the like, of the constituent parts. In the following explanation, similar elements having the same functions and constitutions are represented by the same symbols, respectively, and will not be repeated for brevity. These parts will be explained repeatedly only when it is necessary for a full understanding of the embodiments.

The memory system according to one embodiment includes a nonvolatile semiconductor memory, a data buffer that temporarily stores user data written into the nonvolatile semiconductor memory, a volatile memory storing a management table that uniquely associates the user data with an address of a physical storage region of the nonvolatile semiconductor memory, a controller that carries out a force quit process for writing the user data stored in the data buffer and the management table stored in the volatile memory into the nonvolatile semiconductor memory, and a storage battery that stores electrical energy needed for the force quit process. The controller begins the force quit process before the power supply of an internal power supply regulator is switched from an external power supply to the storage battery.

(Embodiments of the Invention)

In one embodiment, a memory system, that is, a Solid State Drive (SSD) device using a NAND-type flash memory as the nonvolatile semiconductor device will be explained as an example.

[1] Constitution of the Memory System (SSD)

Figure 1:
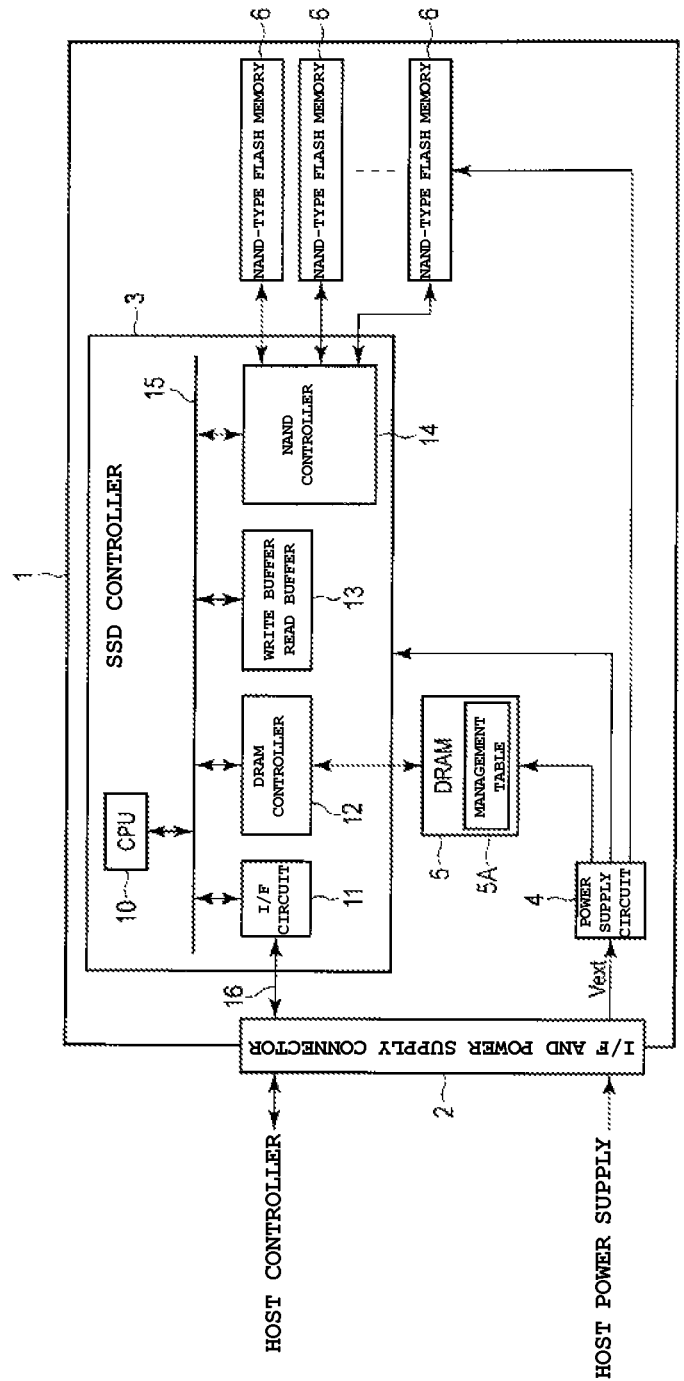
FIG. 1 is a schematic diagram of a SSD according to one embodiment.

FIG. 1 is a schematic diagram of the SSD 1 according to this embodiment. SSD 1 is equipped with a connector 2 constituted appropriately so that it can be easily connected to and removed from a host. The SSD 1 also includes an SSD controller 3, a power supply circuit 4, a volatile memory 5, and plural NAND-type flash memories 6.

The connector 2 includes a connector for host interface and a connector for an external power supply. The SSD controller 3 generally controls the operation of SSD 1. The power supply circuit 4 receives an external power supply voltage Vext from the host (host power supply) and uses the external power supply voltage Vext to supply various kinds of voltages to each circuit in SSD 1. The detailed configuration of power supply circuit 4 will be explained in detail later.

The volatile memory 5 includes, for example, Dynamic Random Access Memory (DRAM). DRAM 5 is used as the operation region of the SSD controller 3. The SSD controller 3 can freely rewrite the data of DRAM 5. The tables and the like needed in various kinds of operations are also stored in DRAM 5. A management table 5A, to be described later, is included in the tables stored in DRAM 5.

The SSD controller 3 is equipped with a processor, such as a central processing unit (CPU) 10, an interface (I/F) circuit 11, a DRAM controller 12, a data buffer (write buffer and read buffer) 13, a NAND controller 14, and a bus 15. The circuits in the SSD controller 3 are connected to each other via the bus 15.

The CPU 10 controls various kinds of operations in the SSD controller 3. For example, the CPU 10 interprets and executes instructions from a host controller, executes the program stored in the NAND-type flash memory 6, and maintains the status of the execution result.

The interface circuit 11 is connected to the host controller with the aid of the interface 16. The interface circuit 11 executes the interface processing with the host controller. For example, Serial Attached SCSI (SAS) or Serial Advanced Technology Attachment (SATA), or the like, is used as the interface 16.

The DRAM controller 12 carries out the interface processing with DRAM 5. More specifically, the DRAM controller 12 supplies commands and addresses to DRAM 5 and exchanges data with DRAM 5.

The data buffer 13 includes a write buffer that temporarily stores the user data (write data) to be written into the NAND-type flash memory 6 and a read buffer that temporarily stores the user data (read data) read out from the NAND-type flash memory 6.

The NAND controller 14 carries out the interface processing with the NAND-type flash memory 6. More specifically, the NAND controller 14 supplies commands and addresses to the NAND-type flash memory 6 and exchanges data with the NAND-type flash memory 6. During transmission and reception of data, the NAND controller 14 carries out Error Checking and Correcting (ECC) processing. Also, the NAND controller 14 processes a plurality of NAND-type flash memories 6 in parallel.

Figure 2:
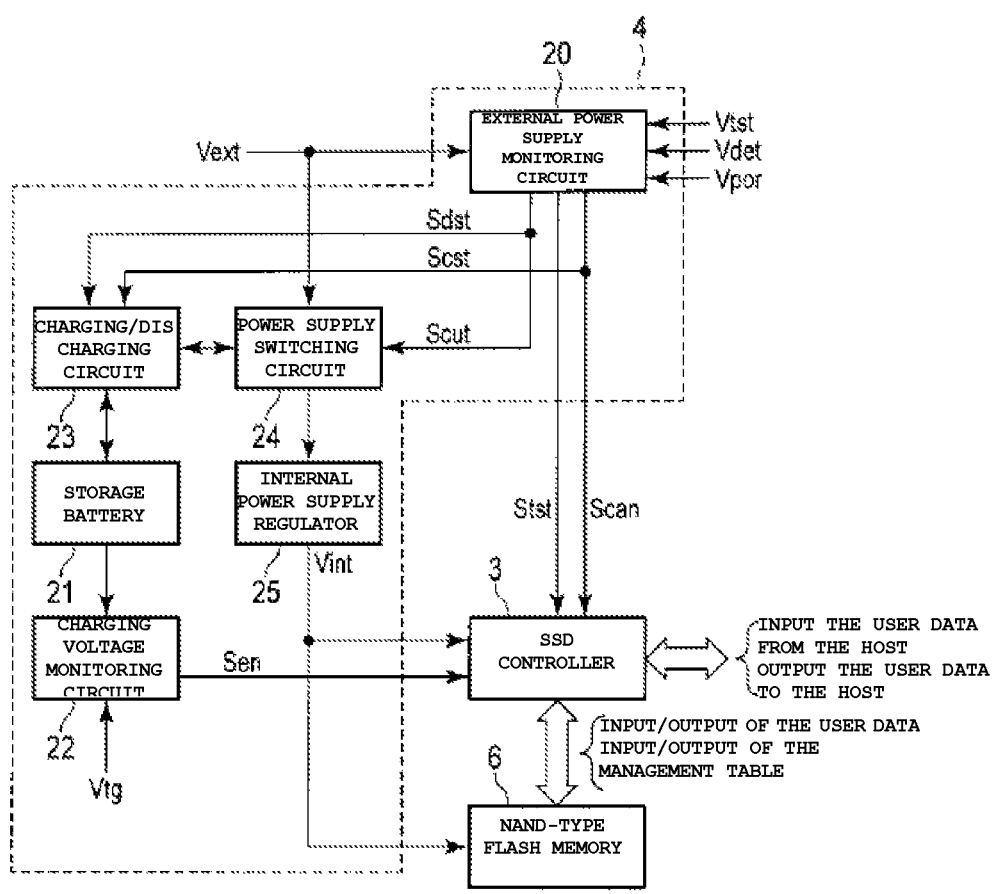
FIG. 2 is a schematic diagram of the power supply circuit shown in FIG. 1.

In the following, the configuration of the power supply circuit 4 shown in FIG. 1 will be explained. FIG. 2 is the block diagram of the power supply circuit 4. The power supply circuit 4 is equipped with an external power supply monitoring circuit 20, a storage battery 21, a charging voltage monitoring circuit 22, a charging/discharging circuit 23, a power supply switching circuit 24, and an internal power supply regulator 25.

The external power supply monitoring circuit 20 receives an external power supply voltage Vext from the host. The external power supply monitoring circuit 20 has power on reset voltage Vpor, power supply voltage abnormality detecting voltage Vdet, and force-quit start voltage Vtst as the threshold voltages. The external power supply monitoring circuit 20 compares the level of external power supply voltage Vext with the threshold voltages. The external power supply monitoring circuit 20 generates a discharge starting signal Sdst, charge starting signal Scst, external power supply cutoff signal Scut, reset release signal Scan, and a force-quit start signal Stst as the result of the voltage comparison operation of the external power supply monitoring circuit 20.

The power on reset voltage Vpor is a threshold voltage value for determining that the external power supply voltage Vext has a certain degree of stability and a threshold voltage for the SSD controller 3 to release the reset state. The power supply voltage abnormality detecting voltage Vdet is a threshold voltage used for detecting abnormalities (instability) of external power supply voltage Vext. The external power supply monitoring circuit 20 determines that the external power supply voltage is abnormal when the external power supply voltage Vext becomes lower than the power supply voltage abnormality detecting voltage Vdet.

The force-quit start voltage Vtst is a threshold voltage used for starting a prescribed force quit process. The force-quit start voltage Vtst value is set higher than the power supply voltage abnormality detecting voltage Vdet value and lower than a lowest voltage Vvar value that allows standard operation of the SSD 1 when there is normal variation in the external power supply voltage Vext. In other words, the lowest voltage Vvar is the lowest voltage value of the external power supply voltage Vext that corresponds to some expected variation in the external power supply voltage Vext during normal operation. SSD 1 is designed appropriately so that the normal operation can be guaranteed when the external power supply voltage Vext is higher than the lowest voltage Vvar value that corresponds to normal operation. The relationship between the power on reset voltage Vpor, power supply voltage abnormality detecting voltage Vdet, force-quit start voltage Vtst, and the lowest voltage Vvar that allows variation in the external power supply is Vpor<Vdet<Vtst<Vvar.

The storage battery 21 uses the external power supply voltage Vext to store electrical energy. The storage battery 21 is used as the power supply circuit for backup and generates a backup voltage Vback during discharge. An electrical double layer capacitor or tantalum-based capacitor is used as the storage battery 21.

A charging voltage monitoring circuit 22 has a charging target voltage Vtg as a threshold voltage and monitors the backup voltage Vback of the storage battery 21. The charging voltage monitoring circuit 22 compares the backup voltage Vback of the storage battery 21 with the charging target voltage Vtg and generates a host command enabling signal Sen as a result of the voltage comparison operation. The host command enabling signal Sen is sent to the SSD controller 3.

A charging/discharging circuit 23 controls the charging operation and discharging operation of the storage battery 21. The charging/discharging circuit 23 receives a charge start signal Scst from the external power supply monitoring circuit 20 and receives the external power supply voltage Vext from a power supply switching circuit 24. When the charge start signal Scst is provided, the charging/discharging circuit 23 supplies the external power supply voltage Vext to the storage battery 21 to charge the storage battery 21. Also, the charging/discharging circuit 23 receives a discharge start signal Sdst from the external power supply monitoring circuit 20 and receives the backup voltage from the storage battery 21. When discharge start signal Sdst is provided, the charging/discharging circuit 23 discharges the storage battery 21 and supplies the backup voltage Vback from the storage battery 21 to a power supply switching circuit 24.

The power supply switching circuit 24 receives the external power supply voltage Vext from the host, receives the backup voltage Vback from the charging/discharging circuit 23, and receives the external power supply cutoff signal Scut from the external power supply monitoring circuit 20. When the external power supply cutoff signal Scut is asserted, the power supply switching circuit 24 supplied the backup voltage Vback to an internal power supply regulator 25. When the external power supply cutoff signal Scut is negated, the power supply switching circuit supplies the external power supply voltage Vext to the internal power supply regulator 25.

The internal power supply regulator 25 uses the power supplied from the power supply switching circuit 24 to generate various kinds of internal power supply voltage Vint used in SSD 1. The internal power supply voltage Vint generated by the internal power supply regulator 25 is supplied to the SSD controller 3, DRAM 5, and NAND-type flash memory 6.

Figure 3:
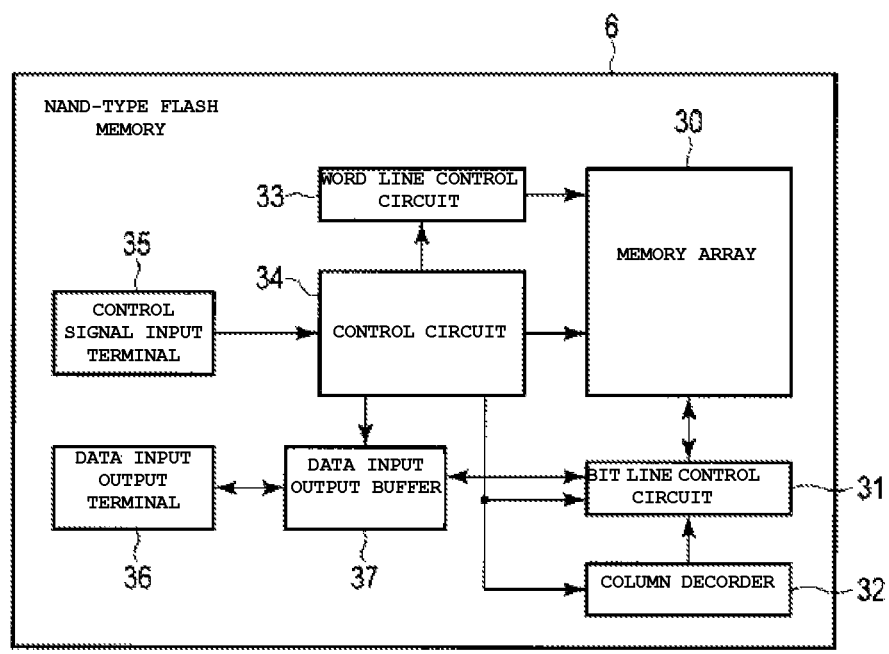
FIG. 3 is a schematic diagram of the NAND-type flash memory shown in FIG. 1.

In the following, the configuration of NAND-type flash memory 6 shown in FIG. 1 will be explained. FIG. 3 is the block diagram of one of the NAND-type flash memories 6 of FIG. 1.

A memory cell array 30 is constituted by disposing memory cells that can electrically rewrite data in a matrix pattern. A plurality of bit lines, a plurality of word lines, and a common source line are disposed in the memory cell array 30. Memory cells are disposed at the cross points of the bit lines and the word lines.

A word line control circuit 33 that functions as a row decoder is connected to the plurality of word lines to select and drive the word line during reading, writing, and erase of the data. A bit line control circuit 31 is connected to the plurality of bit lines to control the voltage of the bit lines during reading, writing, and erase of the data. Also, the bit line control circuit 31 detects the data of the bit lines during reading of the data and applies the voltage corresponding to the data to write to the bit lines during writing of the data. A column decoder 32 generates a column selecting signal used for selecting the bit line corresponding to the address and sends the column selecting signal to the bit line control circuit 31.

The data read out from the memory cell array 30 are sent from a data input/output terminal 36 to the NAND controller 14 via the bit line control circuit 31 and a data input/output buffer 37. Also, the data to write input from the NAND controller 14 to the data input/output terminal 36 are sent to the bit line control circuit 31 via the data input/output buffer 37.

The memory cell array 30, the bit line control circuit 31, the column decoder 32, the word line control circuit 33, and the data input/output buffer 37 are connected to a control circuit 34. The control circuit 34 generates the control signals and control voltages used for controlling the memory cell array 30, the bit line control circuit 31, the column decoder 32, the data input/output buffer 37, and the word line control circuit 33 based on the control signal input from the NAND controller 14 to a control signal input terminal 35.

Figure 4:
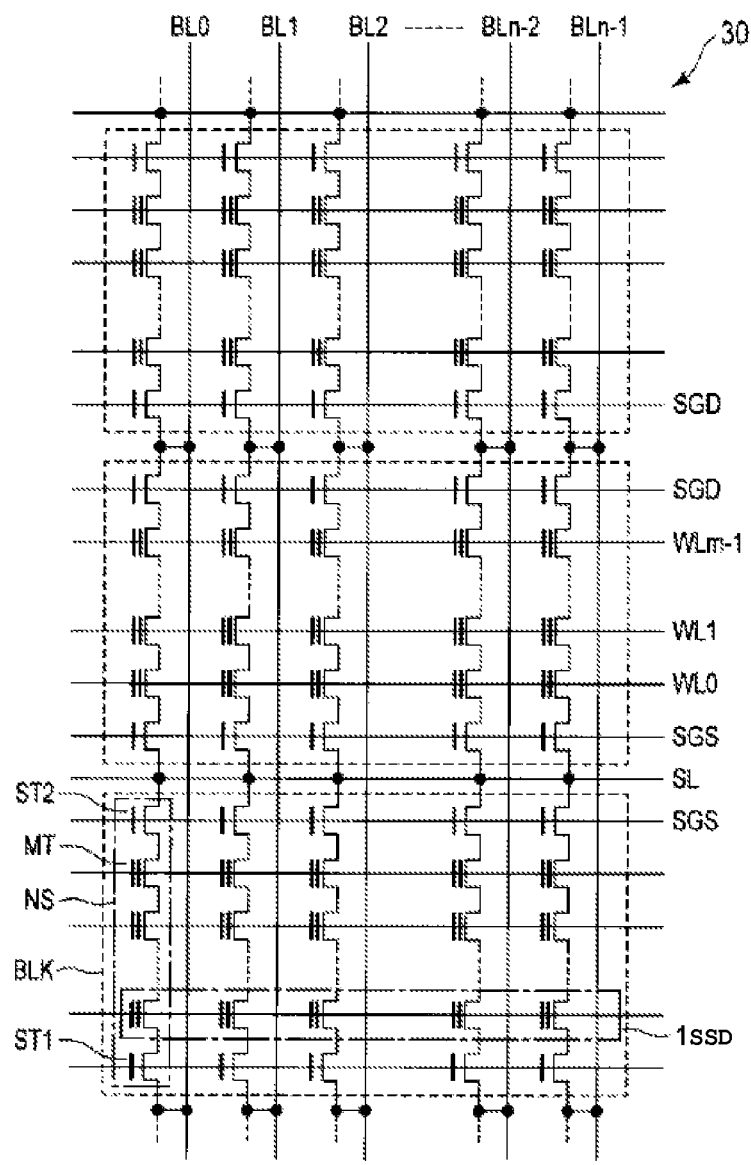
FIG. 4 is a circuit diagram of the memory cell array shown in FIG. 3.

FIG. 4 is the circuit diagram of the memory cell array 30. The memory cell array 30 is equipped with a plurality of blocks BLK. Each block BLK includes a plurality of memory cells. The data are erased in the unit of the block BLK. The block BLK has n (n is a natural number) NAND strings NS.

Each NAND string NS has m (m is a natural number) memory cell transistors (memory cells) MT and two select transistors ST1 and ST2. Each memory cell transistor MT has a laminated gate including a control gate and a charge accumulating layer and stores the data in a nonvolatile manner. The threshold voltage of the memory cell transistor MT varies corresponding to the quantity of charges accumulated in the charge accumulating layer, and the data are stored corresponding to the difference in the threshold voltage.

The m memory cell transistors MT are disposed between select transistors ST1 and ST2 such that their current paths are connected in series. The current path of the memory cell transistor at one end of the serial connection is connected to one end of the current path of select transistor ST1. The current path of the memory cell transistor at the other end is connected to one end of the current path of select transistor ST2.

The gates of the select transistors ST1 in the same block BLK are commonly connected to a select gate line SGD. The gates of the select transistors ST2 in the same block BLK are commonly connected to the select gate line SGS. The control gates of the memory cell transistors MT of one row in the same block BLK are commonly connected to one word line WL.

Among the NAND strings NS disposed in a matrix pattern in the memory cell array 30, the other end of the current path of the select transistors ST1 of NAND strings NS in the same column is commonly connected to one bit line BL. In other words, the bit line BL commonly connects NAND strings NS between a plurality of blocks BLK. Also, the other end of the current path of the select transistor ST2 is commonly connected to the source line SL. The source line SL commonly connects NAND strings NS between, for example, a plurality of blocks BLK.

As described above, the data of the memory cell transistors MT in the same block BLK are erased at the same time. On the other hand, data are read or written for a plurality of memory cell transistors MT commonly connected to one word line WL in one block BLK at the same time. Its unit is known as "page".

[2] Operation of SSD 1

Figure 5:
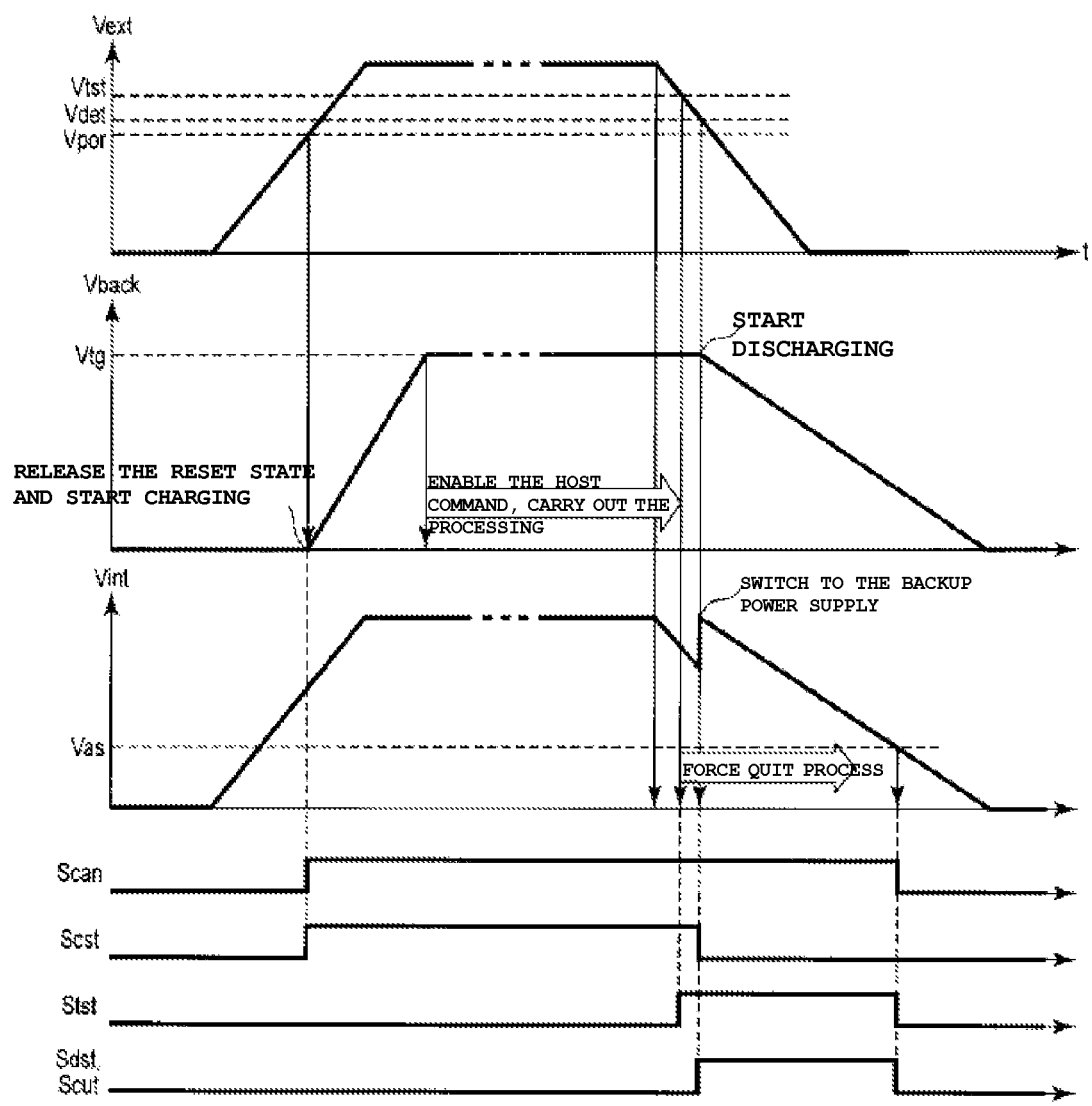
FIG. 5 is a timing diagram illustrating the operation of a SSD according to one embodiment.

In the following, the operation of the SSD 1 with the aforementioned configuration will be explained. FIG. 5 is a timing diagram illustrating the operation of the SSD 1.

First, when power from the external power supply voltage Vext is started from the host (host power supply) to the SSD 1 via the connector 2, the SSD 1 is started, and the SSD controller 3 is reset. The power supply switching circuit 24 supplies the external power supply voltage Vext to the internal power supply regulator 25. The internal power supply regulator 25 starts the generation of the internal power supply voltage Vint.

Then, the external power supply monitoring circuit 20 monitors the level of the external power supply voltage Vext. When the level of the external power supply voltage Vext becomes higher than the power on reset voltage Vpor, the charge start signal Scst and the reset release signal Scan are asserted (high level).

When the reset release signal Scan is asserted, the SSD controller 3 releases the reset state. When the charge start signal Scst is asserted, the charging/discharging circuit 23 supplies the external power supply voltage Vext from the power supply switching circuit 24 to the storage battery 21. After that, the storage battery 21 starts charging.

Subsequently, the charging voltage monitoring circuit 22 monitors the level of the backup voltage Vback of the storage battery 21. When the level of the backup voltage Vback reaches the charging target voltage Vtg, the host command enable signal Sen is asserted (high level).

Referring to FIG. 1 and FIG. 5, when the host command enable signal Sen is asserted, the SSD controller 3 starts the data communication with the host controller. In other words, the SSD controller 3 receives a command from the host controller and carries out the processing corresponding to the command. The normal operations of SSD controller 3 include the data writing operation, reading operation, and erasing operation. More specifically, during the data writing operation, the SSD controller 3 temporarily stores the user data input from the host controller in a write buffer 13 and sequentially writes the user data stored in the write buffer 13 into the NAND-type flash memory 6. Also, during the data reading operation, the SSD controller 3 sequentially reads out the user data from the NAND-type flash memory 6 and temporarily stores the read user data in the read buffer 13. Then, the SSD controller 3 sequentially outputs the user data stored in the read buffer 13 in the unit of a prescribed data size to the host controller.

Also, before performing input/output of the data with respect to the host controller, the SSD controller 3 reads management table 5A from the NAND-type flash memory 6 and stores the management table 5A in DRAM 5. The management table 5A is used to uniquely associate the user data managed by the host controller with the address of the physical storage region (physical address) of the NAND-type flash memory 6. In other words, the management table 5A uniquely associates the logical address managed by the host controller and the physical address that is actually written into the NAND-type flash memory 6 with respect to the user data. The SSD controller 3 performs input/output of the user data with respect to the host controller while carrying out address conversion between the logical address and the physical address with reference to the management table 5A. Also, the SSD controller 3 rewrites the management table 5A to the newest information every time when input/output of the user data is performed with respect to the host controller.

Subsequently, when the level of the external power supply voltage Vext becomes lower than the force-quit start voltage Vtst, the external power supply monitoring circuit 20 asserts (high level) force-quit start signal Stst. When the force-quit start signal Stst is asserted, the SSD controller 3 starts the force quit process. More specifically, the SSD controller 3 writes the user data stored in the write buffer 13 and the management table 5A stored in DRAM 5 in the NAND-type flash memory 6. At that time, the power supply of the internal power supply regulator 25 is not switched from the external power supply (external power supply voltage Vext) to the backup power supply (backup voltage Vback). Consequently, the electrical energy of the storage battery 21 is not consumed during the period when the force quit process is being carried out.

Subsequently, when the level of the external power supply voltage Vext becomes lower than the power supply voltage abnormality detecting voltage Vdet, the external power supply monitoring circuit 20 asserts (high level) discharge start signal Sdst and external power supply cutoff signal Scut. When the discharge start signal Sdst and the external power supply cutoff signal Scut are asserted, the power supply of the internal power supply regulator 25 is switched from the external power supply (external power supply voltage Vext) to backup power supply (backup voltage Vback). In other words, when the discharge start signal Sdst is asserted, the charging/discharging circuit 23 starts to discharge the storage battery 21 and supplies the backup voltage Vback of the storage battery 21 to the power supply switching circuit 24. When the external power supply cutoff signal Scut is asserted, the power supply switching circuit 24 supplies the backup voltage Vback to the internal power supply regulator 25. In this way, the electrical energy accumulated in the storage battery 21 is supplied to the internal power supply regulator 25. The internal power supply regulator 25 then uses the backup voltage Vback to generate the internal power supply voltage Vint.

Subsequently, when the level of the backup voltage Vback becomes lower than the lowest voltage Vas for guaranteeing the regulator output, the operation of SSD 1 is ended, and the various signals are negated. The lowest voltage Vas for guaranteeing the regulator output is the lowest voltage needed for the internal power supply regulator 25 to generate a desired internal power supply voltage Vint. Since the period from the time when the force-quit start signal Stst is asserted to the time when it is negated is sufficiently long, the force quit process can be completed in a reliable manner.

[3] Effects

As described above, in this embodiment, in addition to the power supply voltage abnormality detecting voltage Vdet used for determining the abnormality of the external power supply voltage Vext, the force-quit start voltage Vtst used for starting the force quit process is also set as the threshold voltage of the external power supply monitoring circuit 20. The force-quit start voltage Vtst is set higher than the power supply voltage abnormality detecting voltage Vdet but lower than the lowest voltage Vvar that allows variation in the external power supply. The SSD controller 3 starts the force quit process before switching the power supply of the internal power supply regulator 25 from the external power supply voltage Vext to the storage battery 21.

Consequently, according to this embodiment, it is possible to prolong the period from the point when the force quit process is completed to the point when the electrical energy of the storage battery 21 is consumed. In other words, it is possible to prolong the time period from the point when the force quit process is ended to the point when the input voltage of the internal power supply regulator 25 reaches the lowest voltage Vas that guarantees the regulator output. As a result, the capacity of the storage battery 21 used as the backup power supply can be reduced. Also, since the size of the storage battery 21 can be reduced, the assembly space of the storage battery can be reduced.

Also, when the storage capacity of SSD 1 is increased, it is possible to provide a storage battery with higher capacity in the SSD 1. In this way, even if the storage capacity of SSD 1 is increased, it is possible to provide a storage battery in a size that satisfies the limitation on the SSD package appearance, and the force quit process can be carried out reliably.

An exemplary case is supposed in a conventional system where the force quit process is started after the power supply of the SSD is switched from the host power supply to the storage battery. In this system, it is necessary to supply all of the electrical energy using the storage battery until the force quit process is completed. Therefore, in this system, it is highly unlikely that the force quit process can be completed. In particular, since the storage capacity of the SSD is increased and the data size of the management table is also increased, there is a high probability that the force quit process cannot be completed. The memory system (SSD 1) according to embodiments described herein, however, can prevent this problem.

In the aforementioned embodiments, the SSD 1 is equipped with DRAM 5 and is constituted appropriately to store a management table in the DRAM 5. However, various embodiments other than the one shown in FIG. 1 can be applied to the constitution of SSD 1. For example, it is also possible to use SRAM in the SSD controller 3 as the volatile memory instead of DRAM 5 and store the management table in the SRAM. Also, it is possible to add a SRAM into the SSD controller 3 in addition to DRAM 5 as the volatile memory and store the management table in the SRAM. Thus, the component for disposing the volatile memory used for storing the management table can be modified in many ways as described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device that operates using power supplied from an external power source that is external to the memory device and from a storage battery that is provided in the memory device, comprising:
   a nonvolatile semiconductor memory;
   a data buffer for temporarily storing user data to be written into the nonvolatile semiconductor memory;
   a volatile memory for storing a management table that uniquely associates the user data with an address of the nonvolatile semiconductor memory; and a controller configured to initiate a process to save the user data and the management table into the nonvolatile semiconductor memory using the external power source as a main power source, when a voltage of the external power source becomes lower than a first threshold value.

2. The memory device of claim 1, further comprising:
a monitoring circuit configured to monitor the voltage of the external power source.

3. The memory device of claim 2, wherein the monitoring circuit is further configured to compare the voltage of the external power source with the first threshold value to determine whether to initiate the process and with a second threshold value that is smaller than the first threshold value to identify that the external power source is operating abnormally.

4. The memory device of claim 3, further comprising:
a switching circuit configured to switch the main power source from the external power source to the storage battery when the voltage of the external power source becomes lower than the second threshold value.

5. The memory device of claim 4, wherein the monitoring circuit includes the switching circuit.

6. A memory device, comprising:
a nonvolatile semiconductor memory;
a data buffer for temporarily storing user data to be written into the nonvolatile semiconductor memory;
a volatile memory for storing a management table that uniquely associates user data with an address of the nonvolatile semiconductor memory;
a storage battery; and
a controller including a monitoring circuit configured to monitor a voltage of an external power source that is external to the memory device and a switching circuit configured to switch a main power source for the memory device from the external power source to the storage battery, the controller being configured to initiate a process to save the user data and the management table into the nonvolatile semiconductor memory prior to the main power source for the memory device being switched from the external power source to the storage battery.

7. The memory device of claim 6, wherein the monitoring circuit is further configured to compare the voltage of the external power source with a first threshold value to determine whether to initiate the process and with a second threshold value that is smaller than the first threshold value to identify that the external power source is operating abnormally.

8. The memory device of claim 7, wherein the switching circuit switches the main power source from the external power source to the storage battery, when the voltage of the external power source becomes lower than the second threshold value.

9. The memory device of claim 8, wherein the first threshold value is lower than a lowest voltage value of the external power source that enables the memory device to operate normally.

10. A method for controlling a memory system, comprising:
temporarily storing, in a data buffer, user data to be written into a nonvolatile semiconductor memory using power from an external power source that is external to the memory system;
temporarily storing a management table that associates the user data with an address of the nonvolatile semiconductor memory using power from the external power source;
monitoring a voltage of the external power source; and
initiating a process to save the user data and the management table into the nonvolatile semiconductor memory using the external power source as a main power source, when the voltage of the external power source becomes lower than a first threshold value.

11. The method of claim 10, further comprising:
switching the main power source for the memory system from the external power source to a storage battery when the voltage of the external power source becomes smaller than a second threshold value that is smaller than the first threshold value.

12. The method of claim 11, wherein the first threshold voltage is less than a lowest voltage value of the external power source that enables the memory system to operate normally.

13. The method of claim 10, further comprising:
switching the main power source for the memory system from the external power source to a storage battery, after the process has been initiated.

14. A solid state memory device that operates using power supplied from a host, comprising:
a NAND flash memory;
an SSD controller including a host interface circuit configured to receive data from the host and a NAND interface circuit configured to write the data to the NAND flash memory; and
a monitoring circuit configured to monitor a voltage of power supplied from the host to the solid state memory device, wherein
when the monitored voltage of the power supplied from the host drops below a threshold value, the SSD controller is configured to initiate writing data that have been received from the host and not yet written to the NAND flash memory, to the NAND flash memory, using mainly the power supplied from the host.

15. The solid state memory device according to claim 14, wherein
the threshold value is lower than a lowest voltage value of the power from the host that enables the solid state memory device to operate normally.

16. The solid state memory device according to claim 14, further comprising:
a power regulating circuit that receives power from the host and is configured to regulate power to be supplied to the NAND flash memory and the SSD controller, wherein
the monitoring circuit monitors the voltage of power supplied from the host to the power regulating circuit.

17. The solid state memory device according to claim 14, wherein
the monitoring circuit is further configured to transmit a signal to the SSD controller, when the monitored voltage drops below the threshold value, and
in response to the signal, the SSD controller initiates the writing of said data to the NAND flash memory.

* * * * *